(12) United States Patent
Miftahullatif et al.

(10) Patent No.: US 11,841,402 B2
(45) Date of Patent: Dec. 12, 2023

(54) BATTERY STATE ESTIMATION DEVICE

(71) Applicant: HITACHI, LTD., Tokyo (JP)

(72) Inventors: Emha Bayu Miftahullatif, Tokyo (JP); Toru Kouno, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 17/762,390

(22) PCT Filed: Sep. 14, 2020

(86) PCT No.: PCT/JP2020/034716
§ 371 (c)(1),
(2) Date: Mar. 22, 2022

(87) PCT Pub. No.: WO2021/065443
PCT Pub. Date: Apr. 8, 2021

(65) Prior Publication Data
US 2022/0381846 A1   Dec. 1, 2022

(30) Foreign Application Priority Data

Oct. 2, 2019   (JP) .................. 2019-182417

(51) Int. Cl.
*G01R 31/392*   (2019.01)
*G01R 31/396*   (2019.01)
(Continued)

(52) U.S. Cl.
CPC ......... *G01R 31/392* (2019.01); *G01R 31/374* (2019.01); *G01R 31/3835* (2019.01);
(Continued)

(58) Field of Classification Search
None
See application file for complete search history.

(56) References Cited

U.S. PATENT DOCUMENTS

2014/0015532 A1*  1/2014  Uchida ............... G01R 31/392
                                                    324/426
2014/0084867 A1   3/2014  Hamaoka et al.
(Continued)

FOREIGN PATENT DOCUMENTS

JP     2000-312443 A    11/2000
JP     2011-43460 A     3/2011
(Continued)

OTHER PUBLICATIONS

International Search Report of PCT/JP2020/034716 dated Dec. 1, 2020.
(Continued)

*Primary Examiner* — Jas A Sanghera
(74) *Attorney, Agent, or Firm* — MATTINGLY & MALUR, PC

(57) ABSTRACT

An object of the present invention is to provide a battery state estimation device capable of accurately estimating a deterioration state of an entire battery system in consideration of an SOH distribution of battery cells. The battery state estimation device according to the present invention estimates an SOH of a battery cell by using a correspondence between a time derivative of an output voltage during a pause period of the battery cell and a battery temperature, and estimates a deterioration state of an entire battery system by using the SOHs of a plurality of battery cells (see FIG. 1).

14 Claims, 8 Drawing Sheets

(51) Int. Cl.
  *G01R 31/3835* (2019.01)
  *G01R 31/374* (2019.01)
  *H02J 7/00* (2006.01)
  *H01M 10/48* (2006.01)

(52) U.S. Cl.
  CPC ........ *G01R 31/396* (2019.01); *H01M 10/482* (2013.01); *H01M 10/486* (2013.01); *H02J 7/005* (2020.01); *H01M 2220/10* (2013.01)

(56) References Cited

U.S. PATENT DOCUMENTS

| | | | |
|---|---|---|---|
| 2014/0210267 A1* | 7/2014 | Ishida | H02J 7/00712 320/136 |
| 2015/0311736 A1* | 10/2015 | Park | H02J 7/0047 320/103 |
| 2017/0030976 A1 | 2/2017 | Suzuki et al. | |
| 2017/0082693 A1 | 3/2017 | Leidich et al. | |
| 2017/0139014 A1 | 5/2017 | Yamamoto et al. | |
| 2017/0194673 A1* | 7/2017 | Jeon | H01M 10/425 |
| 2018/0156872 A1 | 6/2018 | Oguma et al. | |
| 2020/0403415 A1 | 12/2020 | Inoue et al. | |

FOREIGN PATENT DOCUMENTS

| | | |
|---|---|---|
| JP | 2014-063693 A | 4/2014 |
| JP | 2018-091716 A | 6/2018 |
| JP | 2018-179684 A | 11/2018 |
| JP | 2019-039764 A | 3/2019 |
| JP | 2019-115088 A | 7/2019 |
| JP | 2019-158666 A | 9/2019 |
| JP | 2020-169943 A | 10/2020 |
| WO | 2015/132891 A1 | 9/2015 |
| WO | 2015/156360 A1 | 10/2015 |
| WO | 2016/098631 A1 | 6/2016 |
| WO | 2016/135913 A1 | 9/2016 |

OTHER PUBLICATIONS

Japanese Office Action received in corresponding Japanese Application No. 2019-182417 dated Jan. 17, 2023.
Extended European Search Report received in corresponding European Application No. 20871587.0 dated Oct. 4, 2023.

* cited by examiner

BATTERY STATE ESTIMATION DEVICE

TECHNICAL FIELD

The present invention relates to a technique for estimating a state of a secondary battery cell.

BACKGROUND ART

Estimating the state of a secondary battery (for example, a deterioration state (state of health (SOH)) during battery operation is important in storage battery systems, electric vehicles, and other similar battery-related systems. The life prediction of the battery is also important for estimating the remaining life of the battery.

In the battery state measurement, the characteristics of the battery have a strong relationship with the battery temperature. In a storage battery system, the temperature of a battery cell changes. Therefore, a measurement method in consideration of the battery temperature is required. As a specific example, a temperature characteristic of a battery impedance depending on a battery temperature is recorded in advance, and the battery state is estimated using the temperature characteristic (PTLs 1 and 2).

The battery system has a plurality of battery cells, and the SOH of each battery cell varies depending on a manufacturing process. This variation is further increased by the temperature distribution of the submodules in the battery cell. This temperature distribution is a factor that accelerates degradation of the battery cell. The battery cells having a high temperature degrade faster than the battery cells having a low temperature. Since the battery cell having the lowest SOH has the highest resistance value, the temperature rise is further accelerated. As a result, the performance of the entire battery system is reduced by the battery cell having the lowest SOH. When only the average SOH is measured without measuring the distribution of SOH, the battery system may be rapidly worn.

CITATION LIST

Patent Literature

PTL 1: JP 2018-091716 A
PTL 2: JP 2019-039764 A

SUMMARY OF INVENTION

Technical Problem

PTLs 1 and 2 assume that the battery temperature is uniform in the battery system. In addition, since these documents require a sine wave or a rectangular wave for impedance measurement, the circuit configuration becomes complicated. Further, the analysis process is complicated because the frequency response needs to be processed to measure the temperature characteristic of the impedance.

When the SOH is estimated by using a parameter depending on temperature, it is necessary to know the battery temperature at the time of measurement. The method of estimating a battery state using a known function as in PTLs 1 and 2 is useful for individually estimating a state of a battery cell having a uniform temperature. However, in order to estimate the SOH distribution in the battery system, it is considered that the temperature distribution in the battery system also needs to be considered.

The present invention has been made in view of the above problems, and an object of the present invention is to provide a battery state estimation device capable of accurately estimating a deterioration state of an entire battery system in consideration of an SOH distribution of battery cells.

Solution to Problem

A battery state estimation device according to the present invention estimates an SOH of a battery cell by using a correspondence between a time derivative of an output voltage during a pause period of the battery cell and a battery temperature, and estimates a deterioration state of an entire battery system by using the SOHs of a plurality of battery cells.

Advantageous Effects of Invention

According to a battery state estimation device of the present invention, the temperature distribution of the battery cell can be reflected on the SOH estimation result. As a result, the deterioration state of the entire battery system can be estimated in consideration of the SOH distribution of the battery cells.

DESCRIPTION OF EMBODIMENTS

\<Basic Concept of Present Invention\>

A stationary storage battery system usually equalizes the capacity of the entire battery system by a balance controller. This balance controller may conceal the true deterioration state of the deteriorated battery cells. In addition, the maximum output voltage (V_max) among the output voltages of the respective battery cells, the minimum output voltage (V_min) among the output voltages of the respective battery cells, and the average output voltage (V_ave) of the respective battery cells are kept substantially constant by the balance controller.

The present inventor has found that a difference between V_max, V_min, and V_ave becomes significant during a pause period after discharge of a battery cell. Therefore, the present invention proposes estimating a deterioration state of a battery system by using a relationship between a battery voltage and a battery temperature during a pause period.

The present inventor has found that the SOH of a battery cell is strongly related to a voltage transition characteristic and a battery temperature during a pause period. This voltage transition characteristic is temperature dependent. The SOH of the battery cell can be estimated by using the correspondence between the voltage transition characteristic and the battery temperature during the pause period. The voltage transition characteristic can be expressed as a time derivative ($\Delta V/\Delta t$) of the voltage. This can be calculated as the voltage difference between two pause period times.

For example, by monitoring the SOH of the battery cell having the maximum temperature and the SOH of the battery cell having the minimum temperature with time, an evaluation parameter similar to the activation energy (Ea) of the battery cell can be calculated as a deterioration state evaluation index of the entire battery system. The deterioration state of the entire battery system can be classified using Ea. Details will be described in a first embodiment.

Further, the SOH distribution of the battery cell can be estimated using at least two of V_max, V_min, and V_ave. The failure rate of the battery system can be estimated using the proportion of the portion deviating from the threshold in the SOH distribution. It is possible to predict a future state of the battery system by specifying which portion of the deterioration curve the estimated failure rate is located. Details will be described in a second embodiment.

First Embodiment

Figure 1:
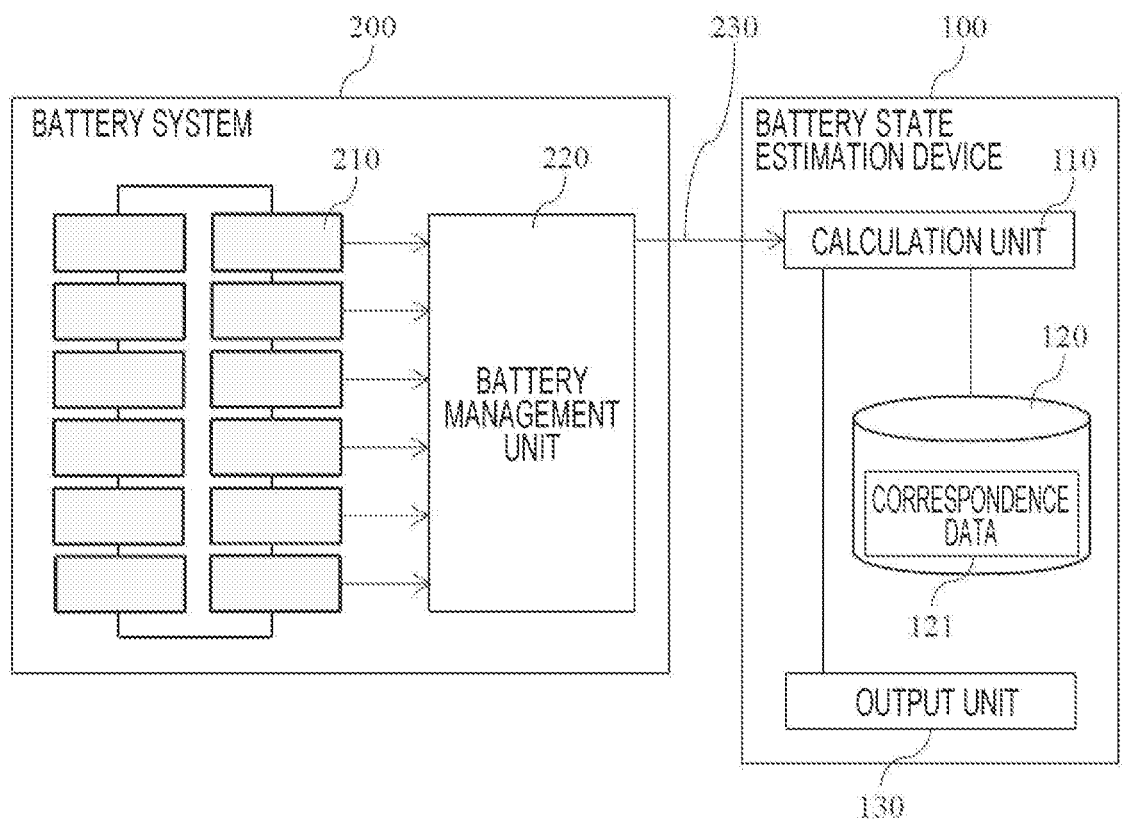
FIG. 1 is a configuration diagram of a battery state estimation device 100 according to a first embodiment.

FIG. 1 is a configuration diagram of a battery state estimation device 100 according to a first embodiment of the invention. The battery state estimation device 100 is a device that estimates the deterioration state of a battery system 200. The battery system 200 is, for example, a stationary storage battery system. The battery state estimation device 100 and the battery system 200 are connected by a communication line. The communication line may be either wired or wireless. For example, an appropriate communication line, a communication network such as the Internet, or the like can be used.

The battery system 200 includes a battery cell 210 and a battery management unit 220. Each battery cell 210 includes a measurement circuit. The measurement circuit measures the output voltage, the battery temperature, and the battery current of the battery cell 210, and transmits the measured values to the battery management unit 220. The battery management unit 220 acquires the output voltage, the battery temperature, and the battery current from each battery cell 210.

The battery management unit 220 acquires the maximum output voltage (V_max) among the output voltages of the respective battery cells 210, the minimum output voltage (V_min) among the output voltages of the respective battery cells, and the average output voltage (V_ave) of the respective battery cells. The battery management unit 220 further acquires the highest temperature (T_max) among the battery temperatures of the respective battery cells 210, the lowest temperature (T_min) among the battery temperatures of the respective battery cells 210, and the average temperature (T_ave) of the battery temperatures of the respective battery cells 210. The battery management unit 220 further acquires a total current (I_tot) of the battery system 200. I_tot can be calculated as the sum of the battery currents of the respective battery cells 210. The battery management unit 220 outputs measurement data 230 describing these seven values.

The battery state estimation device 100 includes a calculation unit 110, a storage unit 120, and an output unit 130. The calculation unit 110 acquires the measurement data 230 via the communication line. The storage unit 120 is a storage device that stores correspondence data 121 to be described later. The calculation unit 110 estimates the deterioration state of the battery system 200 using the measurement data 230 and the correspondence data 121 according to a procedure to be described later. The output unit 130 outputs the estimation result.

Figure 2:
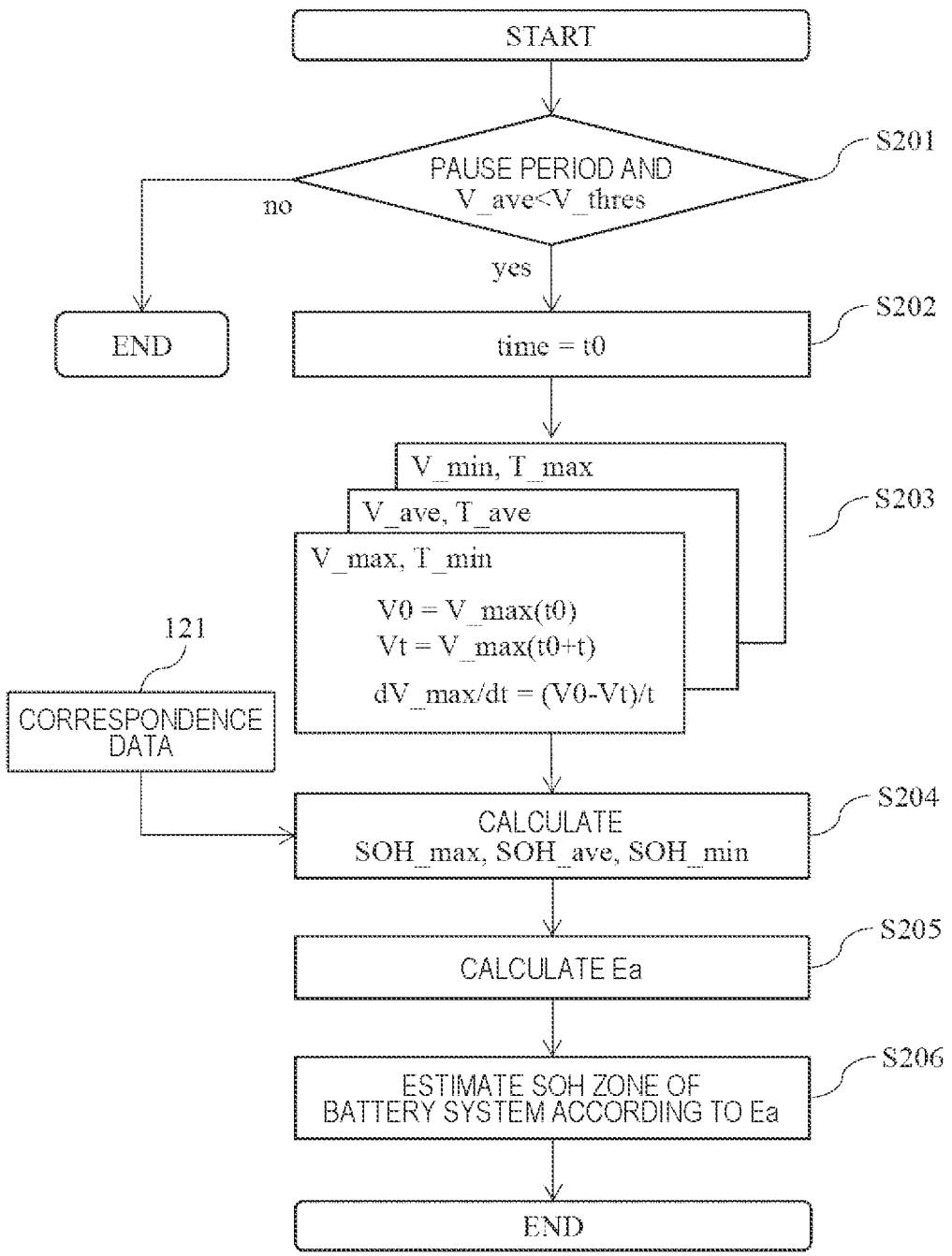
FIG. 2 is a flowchart for explaining a procedure in which a calculation unit 110 estimates a deterioration state of a battery system 200.

FIG. 2 is a flowchart for explaining a procedure in which the calculation unit 110 estimates the deterioration state of the battery system 200. The calculation unit 110 can implement this flowchart, for example, at predetermined intervals. Hereinafter, each step of FIG. 2 will be described.

(FIG. 2: Step S201)

The calculation unit 110 acquires the measurement data 230. The calculation unit 110 can determine whether the battery system 200 is in the pause period after the discharge period by the reference sign of I_tot. That is, if I_tot is positive, it is the discharge period, and if I_tot is negative, it is the charge period. If I_tot is 0±α (α is an appropriate determination threshold), it is a pause period. The calculation unit 110 can thus determine whether it is a pause period after the discharge period. If V_ave is less than a determination threshold V_thres, the calculation unit 110 proceeds to Step S202, and otherwise, this flowchart is ended.

(FIG. 2: Step S202)

The calculation unit 110 sets a current time t0 to a variable time.

(FIG. 2: Step S203)

Figure 3:
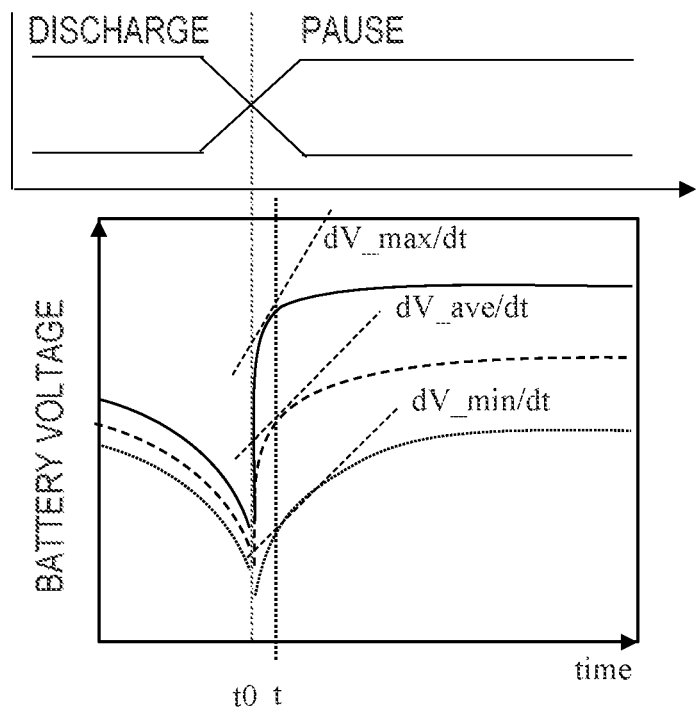
FIG. 3 is a graph illustrating a temporal change of a battery voltage.

The calculation unit 110 acquires V_max at time t0 and V_max at time (t0+t). The calculation unit 110 calculates the time derivative (dV_max/dt) of V_max by dividing the difference by time t. The calculation unit 110 similarly calculates time derivatives (dV_min/dt) and (dV_ave/dt) for V_min and V_ave. The relationship among the time derivatives is illustrated in FIG. 3.

(FIG. 2: Step S204)

The calculation unit 110 calculates the SOH of the corresponding battery cell 210 by referring to the correspondence data 121 using each time derivative obtained in S203. It is assumed that the battery cell 210 corresponding to V_max has SOH_min, the battery cell 210 corresponding to V_min has SOH_max, and the battery cell 210 corresponding to V_ave has SOH_ave. An example of the correspondence data 121 will be described with reference to FIG. 4.

(FIG. 2: Step S205)

The calculation unit 110 calculates an evaluation parameter Ea representing the deterioration state of the battery system 200 using at least two of the three SOHs (SOH_max, SOH_min, SOH_ave) obtained in S204. Ea can be calculated, for example, according to the same concept as the activation energy of the battery cell 210. A specific example of the calculation procedure will be described with reference to FIG. 5.

(FIG. 2: Step S206)

The calculation unit 110 estimates an SOH zone indicating the deterioration state of the battery system 200 according to the evaluation parameter Ea calculated in S205. An example of the SOH zone will be described with reference to FIG. 6.

FIG. 3 is a graph illustrating a temporal change of the battery voltage. The time derivative of the battery voltage greatly changes during the pause period after the discharge period. In addition, the three time derivatives dV_max/dt, dV_min/dt, and dV_ave/dt at the time t to t+t0 have different values.

Figure 4:
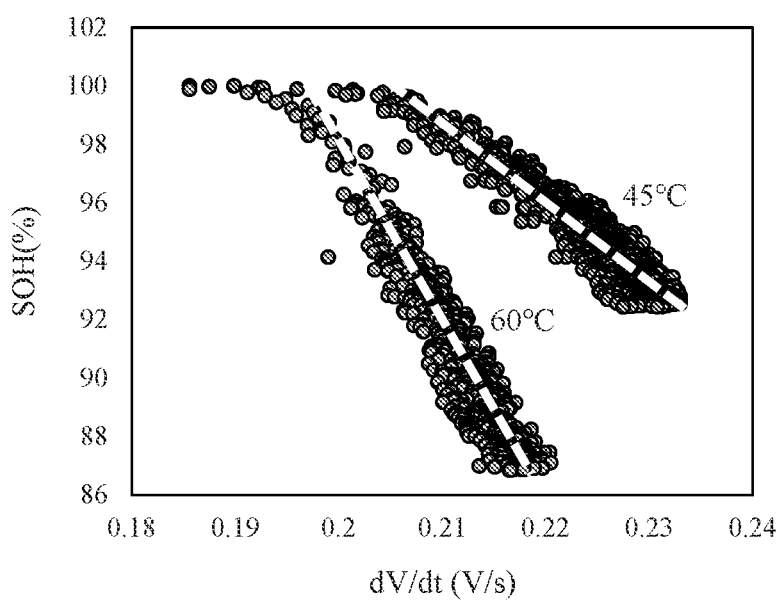
FIG. 4 is an example of correspondence data 121.

FIG. 4 is an example of the correspondence data 121. The relationship between the time derivative dV/dt of the battery voltage and the SOH can be approximated by a linear function (dotted line in FIG. 4). However, the slope of the function varies for each battery temperature. Therefore, in the correspondence data 121, a function representing the correspondence of FIG. 4 is described for each battery temperature (or a mathematical formula for calculating a slope for each battery temperature may also be described). The calculation unit 110 first confirms the function in FIG. 4 by specifying the slope of the function using the battery temperature. The calculation unit 110 obtains the corresponding SOH by substituting the time derivative obtained in S203 into the confirmed function.

The calculation unit 110 assumes that the battery cell 210 that outputs V_max deteriorates under T_min. Therefore, the calculation unit 110 obtains SOH_max by substituting dV_max/dt into the function specified by using T_min. The calculation unit 110 assumes that the battery cell 210 that outputs V_min deteriorates under T_max. Therefore, the calculation unit 110 obtains SOH_min by substituting dV_min/dt into the function specified by using T_max. The calculation unit 110 assumes that the battery cell 210 that outputs V_ave deteriorates under T_ave. Therefore, the calculation unit 110 obtains SOH_ave by substituting dV_ave/dt into the function specified using T_ave.

Figure 5:
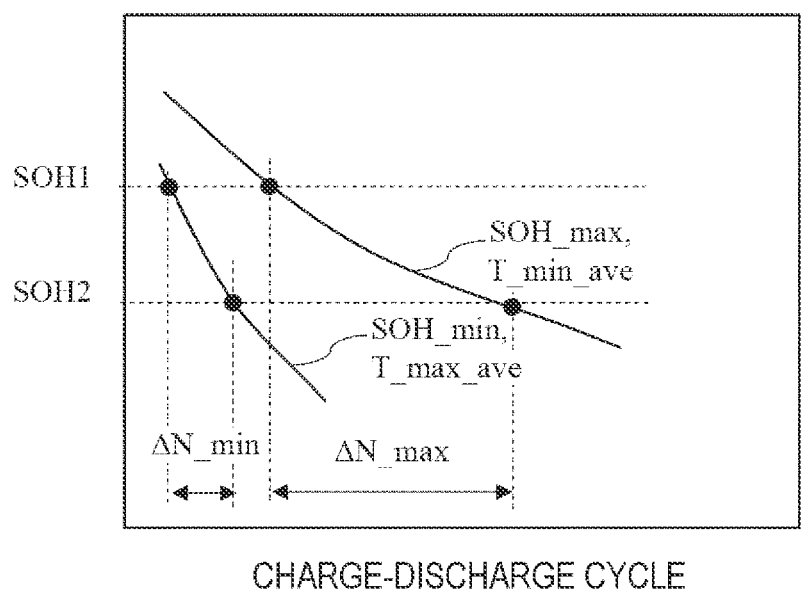
FIG. 5 is a graph illustrating a procedure for calculating an evaluation parameter Ea.

FIG. 5 is a graph for explaining a procedure for calculating the evaluation parameter Ea. Here, an example of using the battery cell 210 having SOH_max and the battery cell 210 having SOH_min will be described.

The number of charge-discharge cycles until the battery cell 210 having SOH_max deteriorates from SOH1 to SOH2 is defined as ΔN_max, and the number of charge-discharge cycles until the battery cell 210 having SOH_min deteriorates from SOH1 to SOH2 is defined as ΔN_min. When the activation energy of the battery cell 210 is Ea, the following Expression 1 is established from the Arrhenius equation. k is a Boltzmann constant. T_max_ave is an average value of T_max from SOH1 to SOH2. T_min_ave is an average value of T_min from SOH1 to SOH2. Further, when Ea is obtained from Expression 1, the following Expression 2 is obtained.

[Math. 1]

$$\frac{\Delta N\_min}{\Delta N\_max} = \exp\left(-\frac{Ea}{k}\left(\frac{1}{T\_max\_ave} - \frac{1}{T\_min\_ave}\right)\right) \quad (1)$$

[Math. 2]

$$Ea = -k \times \left(\frac{\ln(\Delta N\_min) - \ln(\Delta N\_max)}{\left(\frac{1}{T\_max\_ave} - \frac{1}{T\_min\_ave}\right)}\right) \quad (2)$$

Since Expression 2 is calculated from SOH_max and SOH_min, it can be assumed that Expression 2 statistically represents the entire state of the battery system 200. Therefore, it is considered that Ea in Expression 2 can be used as an evaluation parameter similar to the activation energy virtually possessed by the entire battery system 200. Therefore, in S205, the calculation unit 110 calculates Ea as the deterioration state evaluation parameter of the battery system 200.

Figure 6:
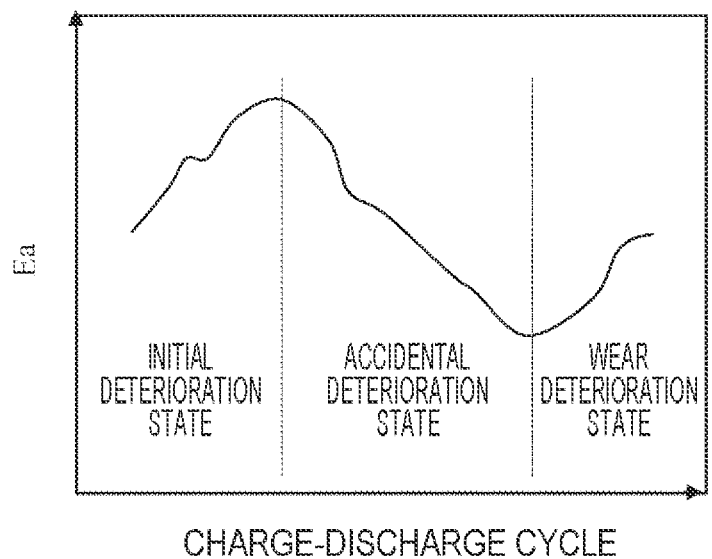
FIG. 6 is a graph showing a temporal change in Ea and a charge-discharge cycle.

FIG. 6 is a graph illustrating a temporal change in Ea and a charge-discharge cycle. It is known that the activation energy of the battery cell 210 changes with time as illustrated in FIG. 6 as the charge-discharge cycle is repeated. It is considered that Ea indicating the deterioration state of the entire battery system 200 changes with time similarly. Therefore, in S206, the calculation unit 110 can estimate the deterioration state of the battery system 200 according to the calculation result of Ea. For example, as illustrated in FIG. 6, the deterioration state can be divided into three zones and estimate in which zone the battery system 200 is currently located.

First Embodiment: Summary

The battery state estimation device 100 according to the first embodiment acquires the battery voltage and the battery temperature of two or more battery cells 210 from the measurement data 230, and refers to the correspondence data 121 using the battery voltage and the battery temperature to obtain the SOH of the battery cells 210. The battery state estimation device 100 estimates the deterioration state of the entire battery system 200 using the SOH. As a result, the deterioration state can be estimated in consideration of the temperature characteristic of dV/dt. In addition, by using the SOHs of two or more battery cells 210, the deterioration state of the entire battery system 200 can be estimated.

The battery state estimation device 100 according to the first embodiment calculates the evaluation parameter Ea from SOH_max and SOH_min. Since Ea is calculated according to the same concept as the activation energy of the battery cell 210, it represents a deterioration state. In addition, since Ea is calculated from SOH_max and SOH_min, Ea represents the entire state of the battery system 200. As a result, the deterioration state of the entire battery system 200 can be estimated in consideration of the temperature characteristic of the battery system 200.

Second Embodiment

In the first embodiment, it has been described that the deterioration state of the entire battery system 200 is estimated using the evaluation parameter Ea similar to the activation energy. In the second embodiment of the present invention, instead of Ea, an example will be described in which the distribution of the SOH of each battery cell 210 in the battery system 200 is estimated, and the failure rate of the battery system 200 is estimated according to the distribution. The configurations of the battery state estimation device 100 and the battery system 200 are similar to those of the first embodiment.

Figure 7:
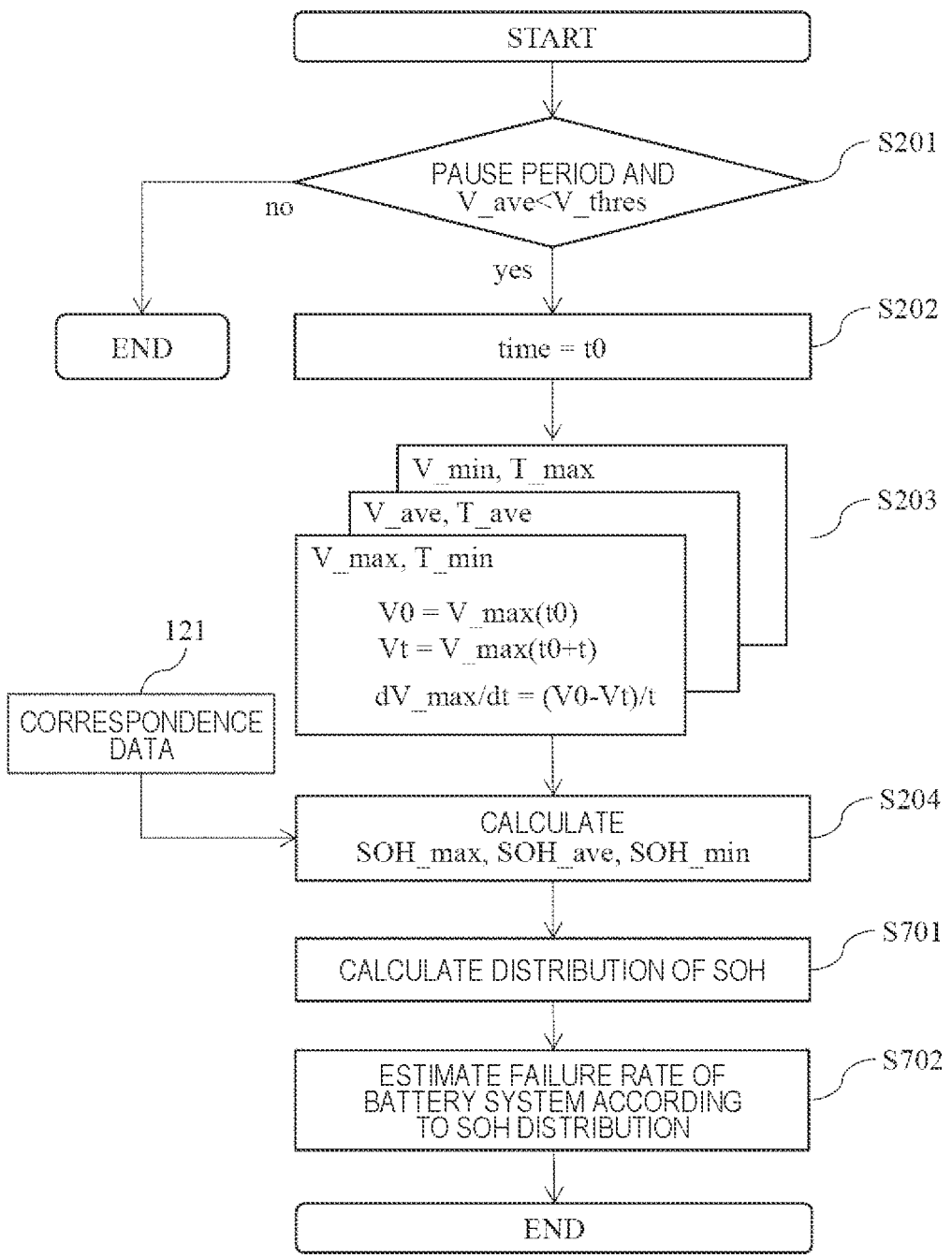
FIG. 7 is a flowchart for explaining a procedure in which the calculation unit 110 estimates a deterioration state of the battery system 200 in a second embodiment.

FIG. 7 is a flowchart for explaining a procedure in which the calculation unit 110 estimates a deterioration state of the battery system 200 in the second embodiment. S701 to S204 are the same as those in FIG. 2. The calculation unit 110 performs S701 to S702 instead of S205 to S206.

(FIG. 7: Step S701)

The calculation unit 110 estimates the distribution of the SOH of each battery cell 210 in the battery system 200 using at least two of the three SOHs (SOH_max, SOH_min, SOH_ave) obtained in S204. A specific example of the estimation procedure will be described with reference to FIG. 8.

(FIG. 7: Step S702)

The calculation unit 110 estimates the failure rate of the battery system 200 according to the SOH distribution calculated in S701. An example of the procedure for estimating the failure rate will be described with reference to FIGS. 9 to 11.

Figure 8:
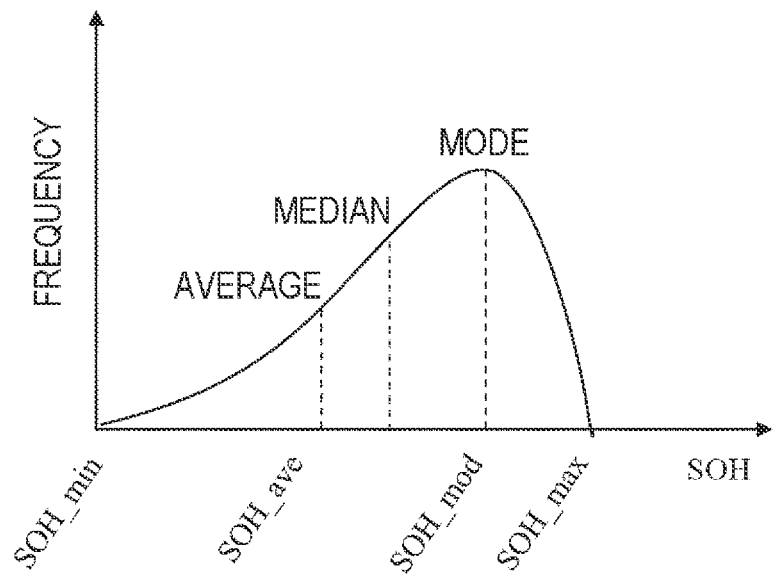
FIG. 8 is an example of SOH distribution of each battery cell 210 in the battery system 200.

FIG. 8 is an example of the distribution of the SOH of each battery cell 210 in the battery system 200. The calculation unit 110 can estimate the frequency distribution (or probability distribution) of the SOH of each battery cell 210 by using at least two of the three SOHs (SOH_max, SOH_min, SOH_ave). FIG. 8 illustrates a result of estimating the distribution according to the following definition using three SOHs.

Average value of SOH=SOH_ave
Median SOH=(SOH_max+SOH_min)/2
Mode of SOH=3×Median−2×Average (=SOH_mod)

In the above example, the SOH distribution is estimated using three SOHs, but the SOH distribution can be estimated if there are at least two SOHs. For example, assuming that the SOH distribution is a normal distribution, the SOH distribution can be estimated using SOH_max and SOH_min. Further, by assuming that SOH_ave=(SOH_max+SOH_min)/2 is satisfied, the SOH distribution can be estimated by using SOH_ave and SOH_max or SOH_ave and SOH_min.

Figure 9:
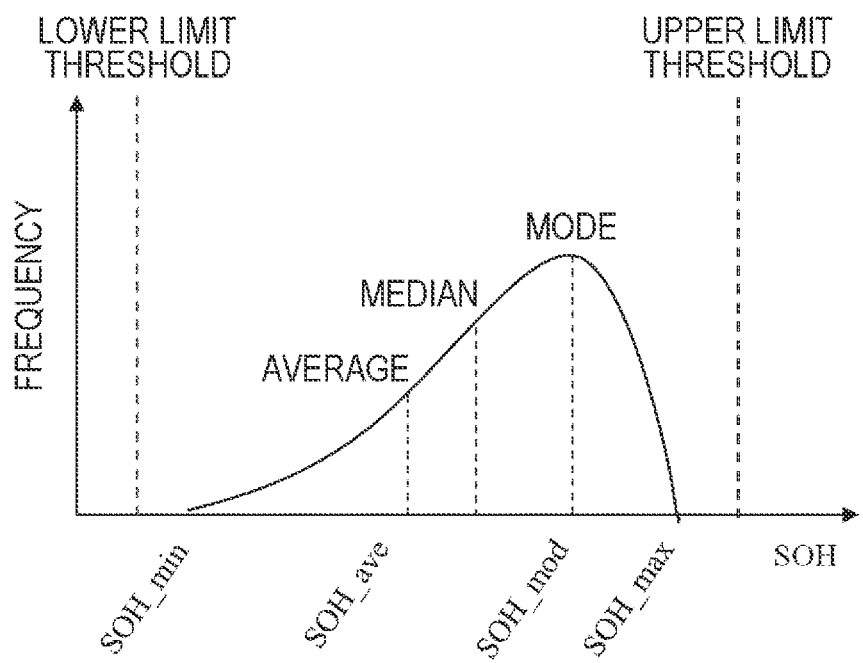
FIG. 9 illustrates an example in which a lower limit threshold and an upper limit threshold are set for the SOH distribution.

FIG. 9 illustrates an example in which the lower limit threshold and the upper limit threshold are set for the SOH distribution. For example, the calculation unit 110 sets the lower limit threshold and the upper limit threshold for the SOH distribution according to the following Expressions. When the SOH distribution deviates from any of the thresholds, it can be estimated that the deterioration state of the battery cell 210 corresponding to the deviation portion is abnormal. Cpk is a constant, and for example, Cpk=1.33.

Figure 10A:
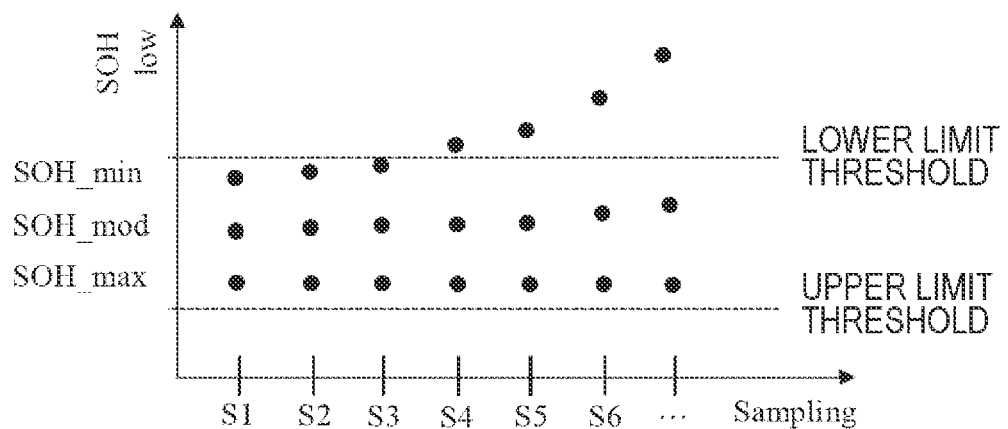
FIG. 10A is a diagram schematically illustrating a process in which an SOH deviates from a threshold.

Upper limit threshold=SOH_mod+(SOH_max−SOH_mod)*Cpk
Lower limit threshold=SOH_mod−(SOH_max−SOH_mod)*Cpk FIG. 10A is a diagram schematically illustrating a process in which the SOH deviates from the threshold. Over time, any of the three SOHs (SOH_max, SOH_min, SOH_ave) may deviate from the threshold. FIG. 10A illustrates an example in which SOH_min deviates from the lower limit threshold. The calculation unit 110 calculates the SOH distribution and the upper and lower limit thresholds described with reference to FIGS. 8 and 9 each time the measurement data 230 is sampled, and determines whether the SOH deviates from the thresholds for each sampling.

Figure 10B:
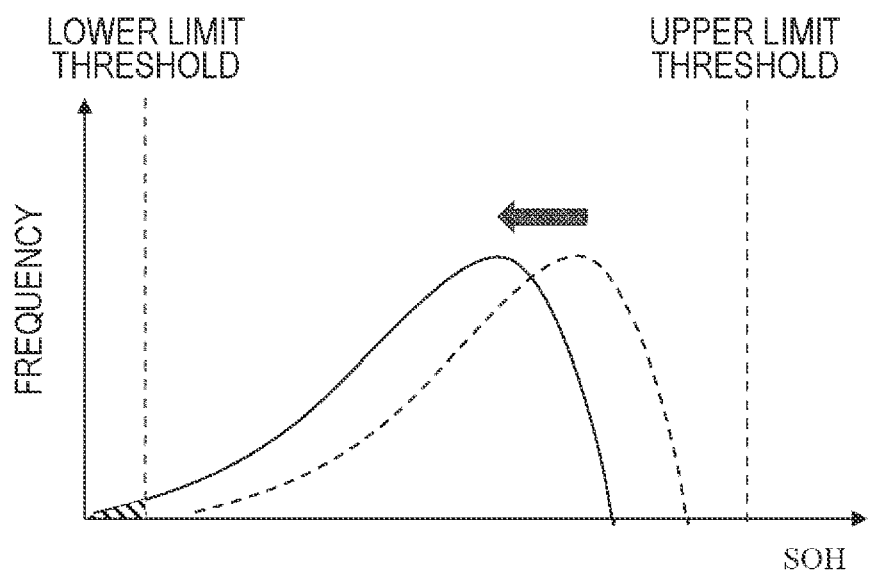
FIG. 10B is a diagram schematically illustrating a change in the SOH distribution due to deviation of the SOH from a threshold.

FIG. 10B is a diagram schematically illustrating a change in the SOH distribution due to deviation of the SOH from the threshold. For example, when SOH_min deviates from the lower limit threshold as illustrated in FIG. 10A, the SOH distribution moves toward the lower limit threshold as a whole, and a part of the SOH distribution protrudes to a region less than the lower limit threshold. The area ratio of the protruding portion (hatched portion in FIG. 10B) to the area of the SOH distribution is regarded as the failure rate of the battery system 200. The calculation unit 110 calculates the area ratio to calculate the failure rate of the battery system 200.

Figure 10C:
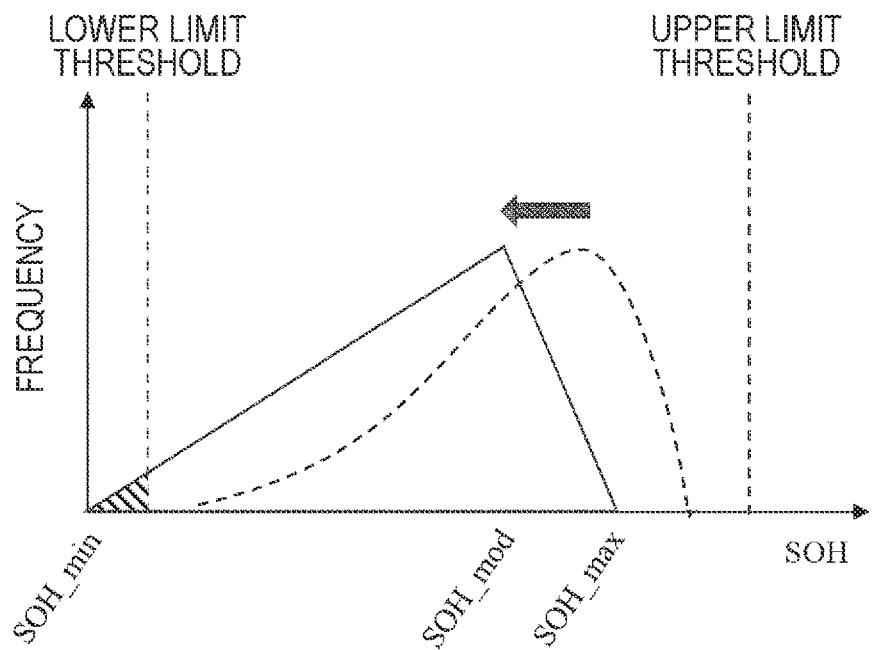
FIG. 10C is a schematic diagram for explaining an example of simply obtaining a failure rate.

FIG. 10C is a schematic diagram for explaining an example of simply obtaining the failure rate. Although FIG. 10B illustrates an example in which the failure rate is calculated using the area of the SOH distribution, the failure rate calculation can be simplified by approximating the shape of the SOH distribution with a triangle. For example, a triangle having SOH_max to SOH_min as a base and SOH_mod as a vertex is regarded as an approximate shape of the SOH distribution. The calculation unit 110 can obtain the area ratio of the portion deviating from the threshold in the triangle as the failure rate of the battery system 200.

Figure 11:
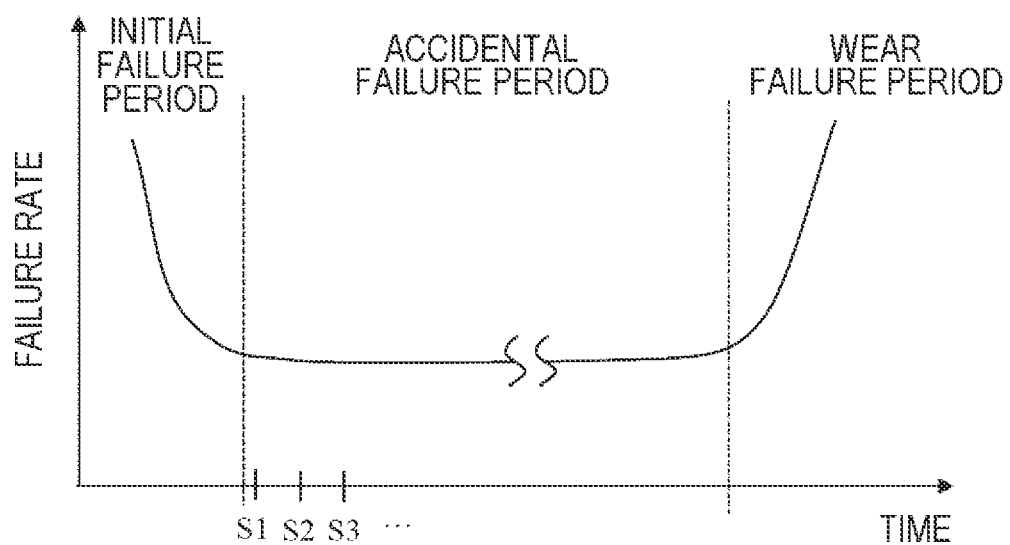
FIG. 11 is an example of a failure rate curve.

FIG. 11 is an example of a failure rate curve. By using the failure rate and the failure rate curve of the battery system 200, the calculation unit 110 can determine the deterioration state of the battery system 200 (for example: whether it is in the wear failure period). The calculation unit 110 outputs the failure rate of the battery system 200 and the deterioration state determined using the failure rate from the output unit 130.

Second Embodiment: Summary

The battery state estimation device 100 according to the second embodiment estimates the frequency distribution of the SOH of each battery cell 210 by using at least two of three SOHs (SOH_max, SOH_min, SOH_ave). The battery state estimation device 100 estimates a deterioration state of the battery system 200 using the estimated SOH distribution. When the SOH distribution is estimated, the SOH is acquired with reference to the correspondence data 121, so that the deterioration state can be estimated in consideration of the temperature characteristic of dV/dt as in the first embodiment. In addition, by using the SOHs of two or more battery cells 210, the deterioration state of the entire battery system 200 can be estimated.

The battery state estimation device 100 according to the second embodiment calculates the failure rate of the battery system 200 by calculating the ratio of the portion deviating from the threshold in the SOH distribution. As a result, it is possible to determine whether the entire battery system 200 is in the wear failure period while considering the temperature characteristics of the battery system 200.

<Modifications of Invention>

The invention is not limited to the above-described embodiments, but various modifications may be contained. For example, the above-described embodiments of the invention have been described in detail in a clearly understandable way, and are not necessarily limited to those having all the described configurations. In addition, some of the configurations of a certain embodiment may be replaced with the configurations of the other embodiments, and the configurations of the other embodiments may be added to the configurations of the subject embodiment. In addition, some of the configurations of each embodiment may be omitted, replaced with other configurations, and added to other configurations.

In the above embodiment, the example of calculating Ea using SOH_max and SOH_min has been described, but SOH_ave can also be used. That is, a combination of any two of three SOHs (SOH_max, SOH_min, and SOH_ave) can be used, or all three SOHs can be used. For example, a method of picking up a combination of any two of three SOHs to obtain Ea, similarly obtaining Ea for other combinations, and averaging them is considered.

In the above embodiment, the correspondence data 121 may be stored in the storage unit 120 in advance, or may be acquired from the outside of the battery state estimation device 100 and stored in the storage unit 120. The correspondence data 121 stored once may be updated.

In the above embodiment, the calculation unit 110 can be configured by hardware such as a circuit device on which the function is implemented, or can be configured by executing software on which the function is implemented by an arithmetic device such as a central processing unit (CPU).

In the above embodiment, the output unit 130 can output the estimation result in an arbitrary format. For example, formats such as screen-displaying on a display device, outputting data describing an estimation result, and the like are conceivable.

In the above embodiment, the stationary storage battery system has been described as an example of the battery system 200, but the present invention can also be applied to other battery systems. For example, an in-vehicle battery system or the like can be considered. In addition, the secondary battery has been exemplified as the battery cell included in the battery system 200, but examples of the secondary battery include a lithium ion battery, a lead storage battery, a nickel hydrogen battery, and an electric double layer capacitor.

REFERENCE SIGNS LIST

100 battery state estimation device
110 calculation unit
120 storage unit
121 correspondence data
130 output unit
200 battery system
210 battery cell
220 battery management unit
230 measurement data

The invention claimed is:

1. A battery state estimation device for estimating a state of a battery system including a plurality of battery cells, the battery state estimation device comprising:
   a storage unit configured to store correspondence data that describes a correspondence among a time derivative of an output voltage during a pause period immediately after discharge of the battery cell, a temperature of the battery cell during the pause period, and a deterioration state of the battery cell; and
   a calculation unit configured to calculate the deterioration state of the battery cell using the correspondence data,
   wherein the calculation unit is configured to acquire measurement data including measurement results of output voltages and battery temperatures of the plurality of battery cells,
   wherein the calculation unit is configured to acquire a first output voltage of a first battery cell of the battery system and acquire a first temperature of the first battery cell from the measurement results of the measurement data,
   wherein the calculation unit is configured to acquire a second output voltage of a second battery cell of the battery system and acquire a second temperature of the second battery cell from the measurement results of the measurement data,
   wherein the calculation unit is configured to estimate a first deterioration state of the first battery cell by referring to the correspondence data and using a time derivative of the first output voltage and the first temperature,
   wherein the calculation unit is configured to estimate a second deterioration state of the second battery cell by referring to the correspondence data and using a time derivative of the second output voltage and the second temperature, and
   wherein the calculation unit is configured to calculate, using the first deterioration state and the second deterioration state, a parameter for evaluating an overall degradation state of the battery system, the parameter corresponding to a difference between the first deterioration state and the second deterioration state, thereby estimating a deterioration state of the entire battery system.

2. The battery state estimation device according to claim 1,
   wherein the calculation unit is configured to acquire, as the first output voltage, any one of a maximum voltage that is largest among the output voltages of the plurality of battery cells, a minimum voltage that is smallest among the output voltages of the plurality of battery cells, and an average voltage of the output voltages of the plurality of battery cells, and acquire any one of the two remaining voltages as the second output voltage,
   wherein the calculation unit is configured to refer to the correspondence data by using the time derivative of the first output voltage and the time derivative of the second output voltage so as to acquire at least two of a least deterioration state among the deterioration states of the plurality of battery cells, a most deterioration state among the deterioration states of the plurality of battery cells, and an average deterioration state of the deterioration states of the plurality of battery cells, and estimate a deterioration state of the entire battery system using the at least two states.

3. The battery state estimation device according to claim 1,
   wherein the calculation unit is configured to acquire, as the first temperature, any one of a highest temperature among the temperatures of the plurality of battery cells, a lowest temperature among the temperatures of the plurality of battery cells, and an average temperature of the temperatures of the plurality of battery cells, and acquire one of the two remaining temperatures as the second temperature, and
   wherein the calculation unit is configured to refer to the correspondence data by using the first temperature and the second temperature so as to acquire at least two of a least deterioration state among the deterioration states of the plurality of battery cells, a most deterioration state among the deterioration states of the plurality of battery cells, and an average deterioration state of the deterioration states of the plurality of battery cells, and estimate a deterioration state of the entire battery system using the at least two states.

4. The battery state estimation device according to claim 1,
   wherein the calculation unit obtains an evaluation parameter representing a deterioration state of the entire battery system by using the first deterioration state and the second deterioration state, and
   wherein the calculation unit uses the evaluation parameter to estimate a deterioration state of the battery system from an initial deterioration state, an accidental deterioration state, or a wear deterioration state.

5. The battery state estimation device according to claim 4,
   wherein the calculation unit is configured to acquire, as the first output voltage, any one of a maximum voltage that is largest among the output voltages of the plurality of battery cells, a minimum voltage that is smallest among the output voltages of the plurality of battery cells, and an average voltage of the output voltages of the plurality of battery cells, and acquire any one of the two remaining voltages as the second output voltage, wherein the calculation unit is configured to acquire a first number of charge-discharge cycles required for the first battery cell to reach a fourth deterioration state from a third deterioration state, wherein the calculation unit is configured to acquire a second number of charge-discharge cycles required for the second battery cell to reach the fourth deterioration state from the third deterioration state, and wherein the calculation unit is configured to calculate the evaluation parameter using the first number of charge-discharge cycles and the second number of charge-discharge cycles.

6. The battery state estimation device according to claim 4, wherein the calculation unit is configured to acquire, as the first temperature, any one of a highest temperature among the temperatures of the plurality of battery cells, a lowest temperature among the temperatures of the plurality of battery cells, and an average temperature of the temperatures of the plurality of battery cells, and acquire one of the two remaining temperatures as the second temperature, wherein the calculation unit is configured to calculate the evaluation parameter assuming that the first battery cell has a time average value of the first temperature until the first battery cell reaches a fourth deterioration state from a third deterioration state, and wherein the calculation unit is configured to calculate the evaluation parameter assuming that the second battery cell has a time average value of the second temperature until the second battery cell reaches the fourth deterioration state from the third deterioration state.

7. The battery state estimation device according to claim 1, wherein the calculation unit is configured to estimate a distribution of deterioration states of the plurality of battery cells using the first deterioration state and the second deterioration state, and wherein the calculation unit is configured to estimate a failure rate of the battery system using the distribution.

8. The battery state estimation device according to claim 7, wherein the calculation unit is configured to acquire a largest output voltage among the output voltages of the plurality of battery cells as the first output voltage, wherein the calculation unit is configured to acquire a smallest voltage among the output voltages of the plurality of battery cells as the second output voltage, wherein the calculation unit is configured to acquire an average voltage of the output voltages of the plurality of battery cells as a third voltage, wherein the calculation unit is configured to refer to the correspondence data using a time derivative of the maximum voltage to acquire a most deterioration state among the deterioration states of the plurality of battery cells as the first deterioration state, wherein the calculation unit is configured to refer to the correspondence data using a time derivative of the minimum voltage to acquire a least deterioration state among the deterioration states of the plurality of battery cells as the second deterioration state, wherein the calculation unit is configured to refer to the correspondence data using a time derivative of the average voltage to acquire an average of the deterioration states of the plurality of battery cells as a third deterioration state, and wherein the calculation unit is configured to estimate the distribution using the first deterioration state, the second deterioration state, and the third deterioration state.

9. The battery state estimation device according to claim 8, wherein the calculation unit is configured to estimate the distribution by calculating at least a mode of the distribution using the first deterioration state, the second deterioration state, and the third deterioration state.

10. The battery state estimation device according to claim 7, wherein the calculation unit is configured to calculate an upper limit allowable value and a lower limit allowable value of the deterioration state of the battery cell using the distribution, and wherein the calculation unit is configured to estimate a failure rate of the battery system according to a ratio of one of the plurality of battery cells which exceeds the upper limit allowable value or one of the plurality of battery cells which falls below the lower limit allowable value.

11. The battery state estimation device according to claim 10, wherein the calculation unit is configured to calculate a first area of a portion exceeding the upper limit allowable value in the distribution and a second area of a portion falling below the lower limit allowable value in the distribution, and wherein the calculation unit uses a ratio of the first area to an area of the distribution and a ratio of the second area to the area of the distribution to calculate a ratio of a battery cell exceeding the upper limit tolerance or a battery cell falling below the lower limit tolerance among the plurality of battery cells.

12. The battery state estimation device according to claim 1, wherein the battery state estimation device further includes an output unit that outputs an estimation result of the deterioration state of the battery system.

13. The battery state estimation device according to claim 1, wherein the battery system is a stationary battery system.

14. The battery state estimation device according to claim 1, wherein the calculation unit is configured to acquire the measurement data from the battery system by communication.

* * * * *